United States Patent
Shimamura et al.

(10) Patent No.: US 8,178,896 B2
(45) Date of Patent: May 15, 2012

(54) LIGHT EMITTING ELEMENT

(75) Inventors: Takayuki Shimamura, Osaka (JP); Masayuki Ono, Osaka (JP); Reiko Taniguchi, Osaka (JP); Eiichi Satoh, Osaka (JP); Masato Murayama, Osaka (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 97 days.

(21) Appl. No.: 12/920,573

(22) PCT Filed: Feb. 24, 2009

(86) PCT No.: PCT/JP2009/000785
§ 371 (c)(1),
(2), (4) Date: Sep. 1, 2010

(87) PCT Pub. No.: WO2009/110187
PCT Pub. Date: Sep. 11, 2009

(65) Prior Publication Data
US 2011/0012167 A1    Jan. 20, 2011

(30) Foreign Application Priority Data
Mar. 5, 2008 (JP) .................................. 2008-054725

(51) Int. Cl.
*H01L 33/32* (2010.01)
(52) U.S. Cl. ..... 257/103; 257/79; 257/94; 257/E33.001; 257/E33.002; 257/E33.013; 257/E33.023; 257/E33.025; 257/E33.027; 257/E33.028; 313/483; 313/498; 313/503
(58) Field of Classification Search ............ 257/79, 257/94, 103, E33.001, E33.002, E33.013, 257/E33.023, E33.025, E33.027, E33.028; 313/483, 498, 503
See application file for complete search history.

(56) References Cited

U.S. PATENT DOCUMENTS

| | | | |
|---|---|---|---|
| 5,925,897 A | 7/1999 | Oberman | |
| 6,780,346 B2 * | 8/2004 | Tamaki et al. | 252/301.4 R |
| 7,709,103 B2 * | 5/2010 | Saito | 428/690 |

(Continued)

FOREIGN PATENT DOCUMENTS

JP    2002-512734    4/2002
(Continued)

OTHER PUBLICATIONS

International Preliminary Report on Patentability and Written Opinion of the International Searching Authority, issued in International Patent Application No. PCT/JP2009/000785, dated Oct. 12, 2010.

*Primary Examiner* — Minh-Loan T Tran
*Assistant Examiner* — William Harriston
(74) *Attorney, Agent, or Firm* — McDermott Will & Emery LLP

(57) ABSTRACT

A light emitting device includes a pair of electrodes facing to each other and a phosphor layer which is sandwiched between the pair of electrodes and includes phosphor particles placed therein. The phosphor particles include an n-type nitride semiconductor part and a p-type nitride semiconductor part, the n-type nitride semiconductor part and the p-type nitride semiconductor part are made of respective single crystals having wurtzite-type crystal structures having c axes parallel with each other, and the phosphor particles include an insulation layer provided to overlie one end surface out of their end surfaces perpendicular to the c axes.

7 Claims, 6 Drawing Sheets

U.S. PATENT DOCUMENTS

| | | | |
|---|---|---|---|
| 7,709,824 B2 * | 5/2010 | Choi et al. | 257/13 |
| 7,858,995 B2 * | 12/2010 | Nakagawa et al. | 257/89 |
| 2002/0117677 A1 * | 8/2002 | Okuyama et al. | 257/94 |
| 2003/0180977 A1 * | 9/2003 | Suzuki et al. | 438/22 |
| 2003/0198837 A1 * | 10/2003 | Craven et al. | 428/698 |
| 2004/0266043 A1 | 12/2004 | Oohata et al. | |
| 2006/0076878 A1 * | 4/2006 | Saito | 313/485 |
| 2006/0175618 A1 | 8/2006 | Ishida | |
| 2007/0111488 A1 * | 5/2007 | Chakraborty et al. | 438/478 |
| 2007/0147453 A1 | 6/2007 | Oohata et al. | |
| 2007/0159063 A1 * | 7/2007 | Kubota et al. | 313/502 |
| 2008/0173845 A1 * | 7/2008 | Ryowa et al. | 252/301.36 |
| 2008/0296626 A1 * | 12/2008 | Haskell et al. | 257/200 |
| 2009/0194761 A1 * | 8/2009 | Masui et al. | 257/13 |
| 2011/0003420 A1 * | 1/2011 | Chen et al. | 438/47 |
| 2011/0133100 A1 * | 6/2011 | Kambhampati et al. | 250/459.1 |

FOREIGN PATENT DOCUMENTS

| | | |
|---|---|---|
| JP | 2006-117735 | 5/2006 |
| JP | 2006-245564 | 9/2006 |
| WO | WO 2004/023569 A1 | 3/2004 |

* cited by examiner 53  52  51
⎵
50

54

LIGHT EMITTING ELEMENT

RELATED APPLICATIONS

This application is the U.S. National Phase under 35 U.S.C. §371 of International Application No. PCT/JP2009/000785, filed on Feb. 24, 2009, which in turn claims the benefit of Japanese Application No. 2008-054725, filed on Mar. 5, 2008, the disclosures of which Applications are incorporated by reference herein.

BACKGROUND

1. Technical Field

The present invention relates to a light emitting element/device which is operated by a direct voltage applied thereto.

2. Background Art

Attention has been focused on nitride semiconductors, as practical semiconductor materials for use in light emitting devices, particularly blue-LEDs; blue light emitting diodes and UV-LEDs; Ultra-violet light emitting diodes, among light emitting devices which are operated by application of direct currents thereto. Particularly, attention has been focused on GaN based semiconductors which are represented by gallium nitride (GaN), indium gallium nitride (InGaN) mixed crystals, aluminum gallium nitride (AlGaN) mixed crystals, indium aluminum gallium nitride (InAlGaN) mixed crystals. Researches and developments have been actively conducted regarding these GaN-based semiconductors.

Conventionally, such GaN-based semiconductors have been fabricated as single-crystal thin films by growing the semiconductors on substrates according to MOCVD (Metal Organic Chemical Vapor Deposition) processing. However, it has been extremely difficult to form single-crystal thin films made of GaN-based semiconductors, through MOCVD processing.

On the other hand, as another candidate for light emitting devices which are operated by direct currents, there are organic ELs. Organic ELs have the advantages that they can be fabricated with lower cost, since inexpensive processing such as vapor deposition processing can be employed and, also, inexpensive substrates such as glasses can be employed. However, such organic ELs have the problem of poor reliability.

Therefore, there have been suggested methods which treat inorganic light emitting members as particles rather than as thin films and, further, arranges such phosphor particles for forming a light emitting device. As advantages of the method, regarding inorganic thin-film type light emitting devices, it is possible to form inorganic light emitting members without causing the members to be influenced by substrates and the like, which can improve the crystallinity of the inorganic light emitting members, thereby easily providing larger areas thereof. Further, regarding organic ELs, it is possible to employ inorganic materials rather than organic materials as light emitting members, which offers the advantage of improvement of the reliability.

As an example of a light emitting device including an arrangement of inorganic phosphor particles, there has been disclosed a technique for providing a nitride semiconductor which forms nucleuses and further providing, on the surface thereof, a phosphor layer made of another nitride semiconductor and, further, laminating a nitride semiconductor layer on this phosphor layer, such that the nitride-semiconductor/phosphor-layer/nitride-semiconductor-layer constitute a quantum well structure, as described in Japanese Patent Laid-open Publication No. 2006-117735.

SUMMARY OF THE INVENTION

However, even when an electroluminescent device is fabricated using phosphor particles according to the conventional technique described in the Patent Document 1, there is the problem of a low light emitting efficiency. There are two reasons therefor. One of them is that such phosphor particles are for exciting the phosphor material through irradiation of an electron beam or irradiation of an ultraviolet ray and, therefore, there is no p-type semiconductor, which reduces the tendency of electrons and holes to recombine to cause light emission. The other one of them is that the conventional technique can not restrict the electric current paths within the phosphor particles, which causes mixture of two electric current paths, which are an electric current path with a lower light emission efficiency and an electric current path with a higher light emission efficiency, thereby resulting in a lower efficiency of the light emitting device. In cases of flowing an electric current through phosphor particles having a wurtzite-type crystal structure for causing light emission therefrom, it is possible to realize a higher efficiency in cases where the electric current path is perpendicular to a direction of the c axis, than that in cases where the electric current path is in the direction of the c axis. This is because in the case where the electric current path is in the direction of the c axis, the energy for use for light emission is partially lost by being influenced by the polarities. Accordingly, in order to cause light emission with a higher efficiency, it is desirable to design the placement of the phosphor particles such that the electric current path is only in a direction perpendicular to the c axis.

Therefore, it is an object of the present invention to provide a light emitting device having a high light emission efficiency and being capable of having a larger area.

A light emitting device according to the present invention includes a pair of electrodes facing to each other; and a phosphor layer which is sandwiched between the pair of electrodes and includes phosphor particles placed therein; wherein the phosphor particle includes an n-type nitride semiconductor part and a p-type nitride semiconductor part, the n-type nitride semiconductor part and the p-type nitride semiconductor part are made of respective single crystals having wurtzite-type crystal structures having c axes parallel with each other, and the phosphor particle includes an insulation layer provided to overlie one end surface out of their end surfaces perpendicular to the c axes.

Further, the phosphor particle may be formed by laminating the n-type nitride semiconductor part and the p-type nitride semiconductor part in a direction perpendicular to the c axes.

Further, the phosphor particle may further include a nucleus crystal made of a single crystal. In this case, the n-type nitride semiconductor part and the p-type nitride semiconductor part can be formed to overlie the periphery of the nucleus.

Further, the phosphor particle may be formed by laminating the p-type nitride semiconductor part and the n-type nitride semiconductor part, in the mentioned order, around the nucleus crystal. Also, the phosphor particle may be formed by laminating the n-type nitride semiconductor part and the p-type nitride semiconductor part, in the mentioned order, around the nucleus crystal.

Further, at least one of the n-type nitride semiconductor part and the p-type nitride semiconductor part which constitute the phosphor particles can be exposed at an outer surface and, further, can be electrically contacted with at least one of the pair of electrodes.

The n-type nitride semiconductor part and the p-type nitride semiconductor part which constitute the phosphor particles can be made of GaN.

In the light emitting device according to the present invention, each phosphor particle constituting the phosphor layer includes the n-type nitride semiconductor part and the p-type nitride semiconductor part. This facilitates light emission in each phosphor particle due to combination of electrons and holes, thereby increasing the light-emitting efficiency.

Further, in the light emitting device according to the present invention, at least one end surface, out of the end surfaces of each phosphor particle which are perpendicular to the c axis, is covered with the insulation film. When the c axe of the phosphor particle is perpendicular to the substrate, the insulation layer of the phosphor particle contacts with an electrode. Thus, the insulation layer prevents an electric current from flowing through the phosphor particle. On the other hand, when the c axe of the phosphor particle is parallel with the substrate, then, the n-type nitride semiconductor part or the p-type nitride semiconductor part at the side surface contacts with the electrodes. Thus, an electric current flows inside the phosphor particle, thereby enabling light emission. As a result, all the electric current paths which contribute to light emission are in a direction perpendicular to the c axe, which realizes high-efficiency light emission, thereby realizing a light emitting device with a high light-emission efficiency.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF REFERENCE CHARACTERS

Figure 1:
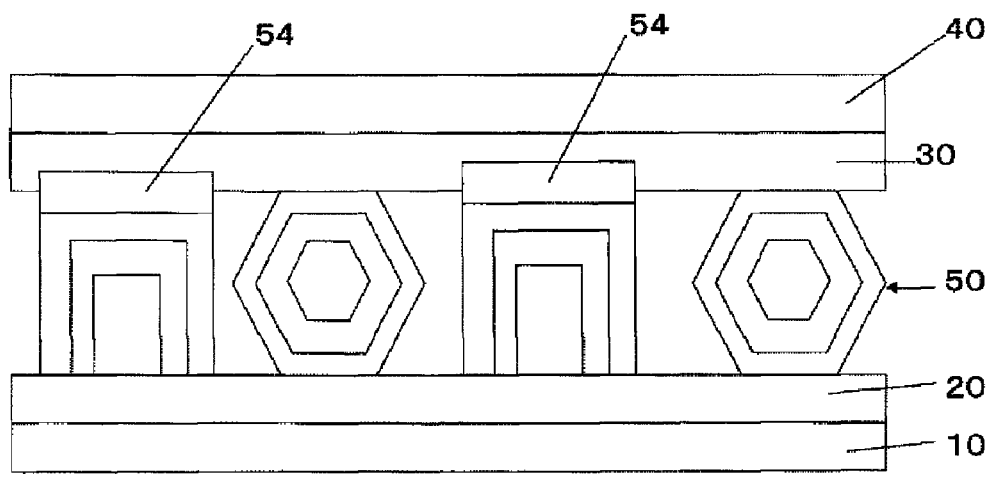
FIG. 1 is a cross-sectional view schematically illustrating the structure of a light emitting device according to a first embodiment of the present invention.

10: Lower substrate
20: Lower electrode
30: Upper electrode
40: Upper substrate
50: Phosphor particle
51: Nucleus
52: N-type semiconductor
53: P-type semiconductor
54: Insulation layer
61: Growth substrate
62: Growth mask
70: Light emitting device
71: Reaction oven
72: Gas line A
73: Gas line B
74: Gas line C
75: Ga metal
76: $MgCl_2$
77: Substrate holder

DETAILED DESCRIPTION OF THE PREFERRED EMBODIMENTS

Hereinafter, a light emitting device according to an embodiment of the present invention will be described, with reference to the accompanying drawings. Further, throughout the drawings, generally, like reference characters designate the same components.

(First Embodiment)

FIG. 1 is a cross-sectional view schematically illustrating the structure of a light emitting device 70 according to the present first embodiment. In the light emitting device 70, on a lower substrate 10, there are placed a lower electrode 20, phosphor particles 50, an upper electrode 30, and an upper substrate 40, in the mentioned order. In the light emitting device 70, the plurality of phosphor particles 50 placed between the lower electrode 20 and the upper electrode 30 form a phosphor layer. Further, FIG. 1 illustrates a minimum structure necessary for light emission, and other members may be provided in addition thereto.

Figure 2:
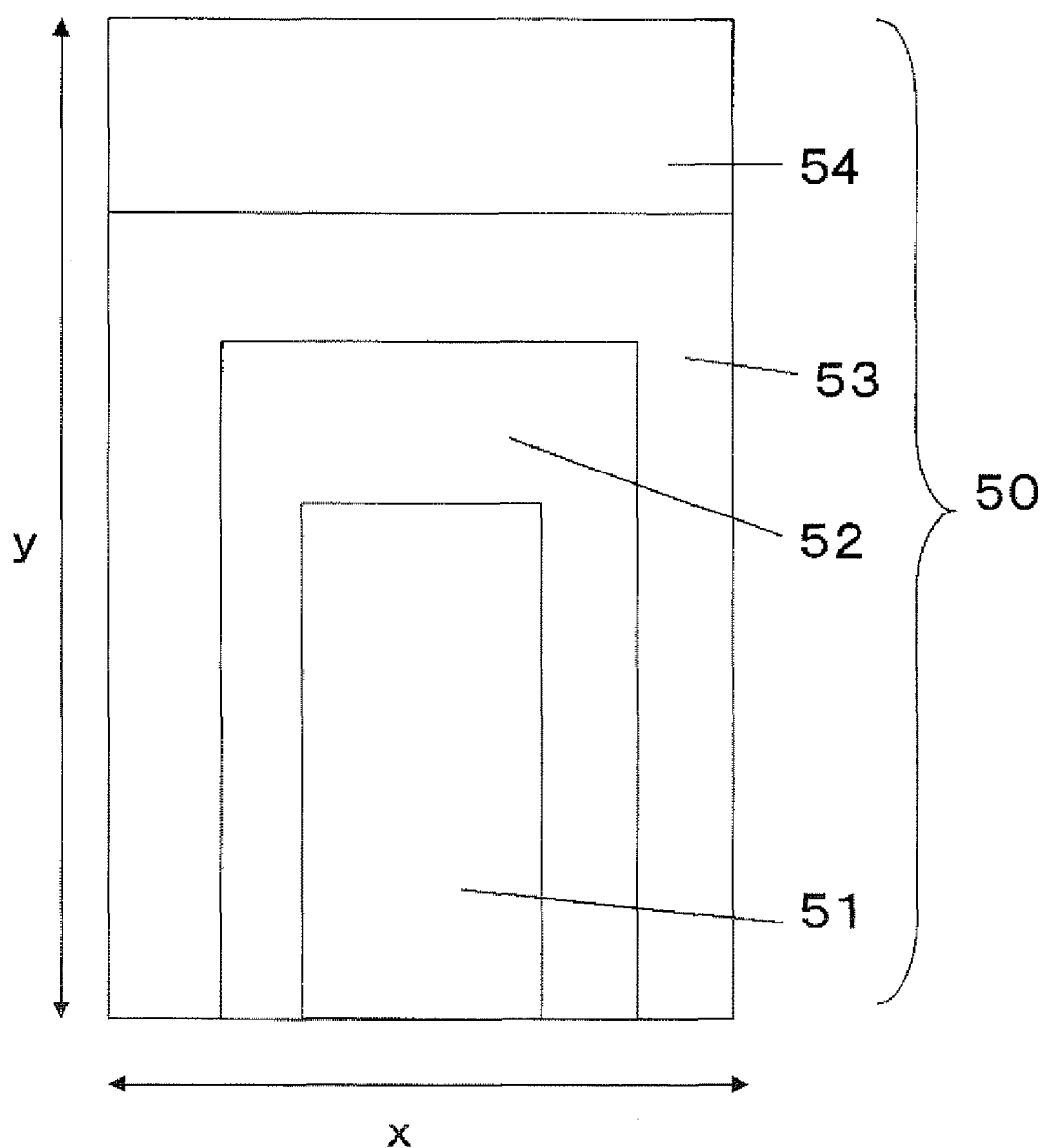
FIG. 2 is a longitudinal cross-sectional view of a phosphor particle taken along the direction of the c axis thereof.
Figure 3:
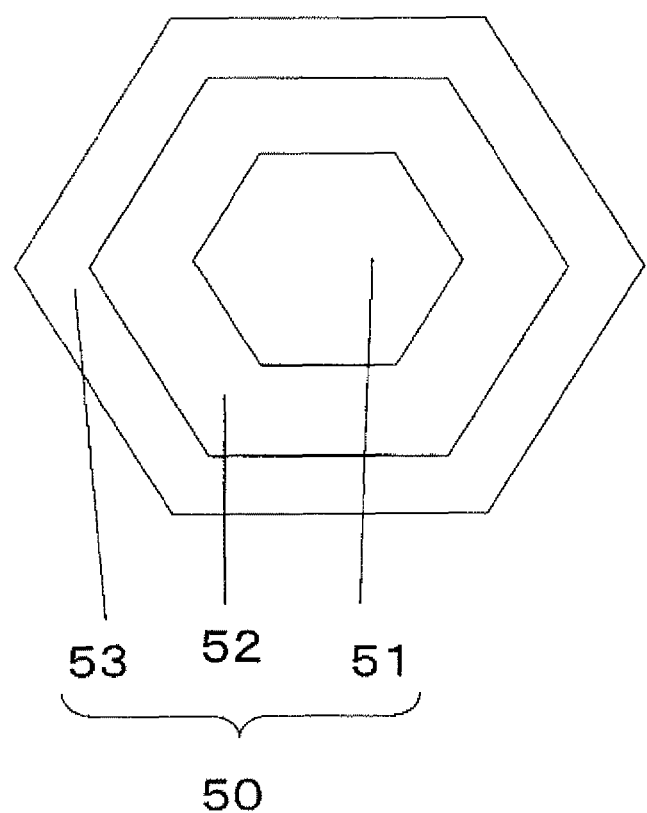
FIG. 3 is a lateral cross-sectional view of the phosphor particle taken along a plane perpendicular to the c axis thereof.

FIG. 2 is a cross-sectional view illustrating the cross-sectional structure of a phosphor particle 50 taken along the direction of the c axis thereof. FIG. 3 is a cross-sectional view illustrating the cross-sectional structure of the phosphor particle 50 taken along a plane perpendicular to the c axis thereof. In the light emitting device 70, each phosphor particle 50 includes an n-type nitride semiconductor 52 and a p-type nitride semiconductor 53 which are formed to overlie the periphery of a nucleus 51. This facilitates light emission in each phosphor particle 50 due to combination of electrons and holes, thereby increasing the light-emitting efficiency. Further, in the light emitting device 70, each phosphor particle 50 is covered with an insulation film 54, at least at one end surface, out of their end surfaces perpendicular to the c axis. Thus, when the c axe of the phosphor particle 50 is perpendicular to the substrates 10 and 40, the insulation layer 54 of the phosphor particle 50 contacts with the lower electrode 20 or the upper electrode 30. The insulation layer 54 prevents an electric current from flowing through the phosphor particle 50. For example, no electric current flows through the phosphor particle 50 placed such that the insulation layer 54 therein contacts with the upper electrode 30, out of the phosphor particle 50 sandwiched between the lower electrode 20 and the upper electrode 30 in FIG. 1. On the other hand, when the c axe of the phosphor particle 50 is parallel with the substrates 10 and 40, the n-type nitride semiconductor 52 or the p-type nitride semiconductor 53 at the side surface contacts with the electrodes 20 and 30. Thus, an electric current flows inside the phosphor particle 50, thereby enabling light emission therefrom. For example, no electric current flows through the phosphor particle 50 placed such that their c axe is parallel with the electrodes 20 and 30, out of the phosphor particle 50 sandwiched between the lower electrode 20 and the upper electrode 30 in FIG. 1. In this case, all the electric current paths which contribute to light emission are in a direction perpendicular to the c axe, which realizes high-efficiency light emission, thereby realizing a light emitting device 70 with a high light-emission efficiency.

Hereinafter, there will be described the respective components constituting the light emitting device 70.

(The Lower Substrate and the Upper Substrate)

The materials of the lower substrate 10 and the upper substrate 40 are not particularly limited, but it is desirable that the lower substrate 10 or the upper substrate 40 has an optically-transparent characteristic, in order to extract light therethrogh. Further, it is also possible to provide only the upper substrate 10 or only the lower substrate 40 as a substrate, provided that it is possible to maintain the form of a light emitting device.

(The Lower Electrode and the Upper Electrode)

The materials of the lower electrode 20 and the upper electrode 30 are not particularly limited, similarly, provided that these materials have electric conductivity. However, it is desirable that the material used in the cathode side is a material having a lower work function, such as aluminum, magnesium, silver, while it is preferable that the material used in the anode side is a material having a higher work function, such as gold, ITO. Further, the electrode in the light-extraction side is made of an optically-transparent material, and in cases of employing, therefor, a material having no optically-transparent property, it is desirable to cause this electrode to have a layer thickness of 100 nm or less, in order to pass emitted light therethrough as much as possible. Further, in cases of employing electrically-conductive substrates, such as metal substrates or Si substrates doped with other elements, in order to cause the electrically-conductive substrates to serve as both substrates and electrodes, there is no need for further providing electrodes. Further, it is desirable that at least one of the lower electrode 20 and the upper electrode 30 has flexibility. Namely, there is a size variation in the phosphor particles 50 and, therefore, when both the lower electrode 20 and the upper electrode 30 have no flexibility, gaps are formed between the electrodes corresponding to larger particles 50 while smaller phosphor particles 50 contact with only one of the electrodes 20 and 30, which increases the number of phosphor particles 50 which can not contribute to light emission. Therefore, by employing a flexible electrode as one of the electrodes, it is possible to cause both the electrodes 20 and 30 to contact with the phosphor particles 50. This can prevent the occurrence of phosphor particles 50 which can not contact with both the electrodes 20 and 30 and can not contribute to light emission, thereby preventing the decrease of the luminance of the light emitting device. Further, in this case, the phosphor particles 50 directly contact with the respective electrodes, but they can be contacted therewith a conductive member or a semiconductor member interposed therebetween.

(The Phosphor Particles)

The phosphor particles 50 will be described, in detail, with reference to FIG. 2 and FIG. 3. FIG. 2 is a longitudinal cross-sectional view of a phosphor particle 50 taken along the direction of the c axis, and FIG. 3 is a lateral cross-sectional view thereof taken along a plane perpendicular to the c axis. The phosphor particle 50 is constituted by a nucleus 51, an n-type semiconductor 52, a p-type semiconductor 53, and an insulation layer 54 from the inner side to the outer side thereof. Further, FIG. 2 and FIG. 3 illustrate a minimum structure necessary for light emission, and other members may be provided therein in addition thereto. For example, it is also possible to provide a semiconductor layer having a band gap narrower than those of the n-type semiconductor 52 and the p-type semiconductor 53 at the boundary between the n-type semiconductor 52 and the p-type semiconductor 53 to form a double-hetero structure. Further, it is also possible to provide a buffer layer for facilitating the growth at the boundary between the nucleus 51 and the semiconductor layer. In the phosphor particle 50, the n-type semiconductor 52 and the p-type semiconductor 53 are grown around the nucleus 51. However, a position at which they are grown is not particularly limited, and they can be partially grown around the nucleus 51.

(The Nucleus)

The nucleus 51 is beneficial for growing the n-type semiconductor 52 or the p-type semiconductor 53. The nucleus 51 is desirably made of a single-crystal material having a wurtzite-type structure, and it is preferable to employ, thereas, a material having a lattice constant which is as close to the lattice constant of the n-type semiconductor 52 or the p-type semiconductor 53 to be grown thereon as possible. For example, in cases where the semiconductor material to be grown thereon is GaN, exemplary candidates for the material of the nucleus 51 include sapphire, ZnO, AlN. Further, it is also possible to employ, as the nucleus 51, the same material as the semiconductor material to be grown thereon.

(The N-Type Semiconductor 52 and the P-Type Semiconductor 53)

As the n-type semiconductor 52 and the p-type semiconductor 53, a nitride semiconductor having a wurtzite-type crystal structure is employed. Exemplary nitride semiconductors having wurtzite-type crystal structures include AlN, GaN, InN, $Al_xGa_{(1-x)}N$, $In_yGa_{(1-y)}N$. Each semiconductor layer 52, 53 is preferably made of a single-crystal material. It is preferable that the c axes of the n-type semiconductor 52 and the p-type semiconductor 53 are parallel with each other. Further, preferably, the n-type semiconductor 52 and the p-type semiconductor 53 are parallel with the c axis of the nucleus 51. As the method for growing single-crystal materials as the n-type semiconductor 52 and the p-type semiconductor 53, it is preferable to employ vapor deposition processing. Exemplary growing methods utilizing vapor deposition include halide vapor phase epitaxy (HVPE) processing and metal organic chemical vapor deposition (MOCVD) processing. According to a method for growing a semiconductor layer utilizing vapor deposition, particles which form nucleuses are placed on a substrate and are heated to a necessary temperature and, thereafter, a raw-material gas is flown thereto to grow a semiconductor layer on the nucleus particles. The semiconductor layer can be doped with Si to form an n-type semiconductor. Further, in cases of a nitride semiconductor, characteristics of an n-type semiconductor are exhibited even when the nitride semiconductor is non-doped and, therefore, a non-doped nitride semiconductor can be employed as an n-type semiconductor. Further, the semiconductor layer can be doped with Mg to exhibit characteristics of a p-type semiconductor. Accordingly, an Mg-doped nitride semiconductor can be employed as a p-type semiconductor.

(The Insulation Layer 54)

The insulation layer 54 is formed to overlie at least one end surface, out of the end surfaces of the phosphor particle 50 which are perpendicular to the c axis thereof. The material thereof can be any material having an insulation property. For example, it is possible to employ $Al_2O_3$, $SiO_2$, $TiO_2$, $BaTiO_3$.

(Method for Forming the Phosphor Particles)

The method for processing for forming the phosphor particles 50 is not limited, but an exemplary formation processing will be described with reference to FIGS. 4A to 4G.

Figure 4A:
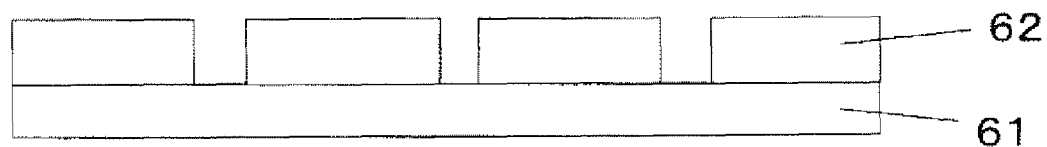
FIG. 4A is a schematic view illustrating a single process in a method for fabricating phosphor particles for use in a light emitting device according to the first embodiment.

(a) A growth mask 62 is formed, as in FIG. 4A, on a growth substrate 61 for growing phosphor particles 50 thereon (FIG. 4A). In this case, the growth substrate 61 is required to be capable of withstanding the processing for forming the nucleuses 51, the n-type semiconductor 52, and the p-type semiconductor 53 which are to be formed thereon later. For example, in cases of employing halide vapor phase epitaxy (HVPE) processing or metal organic chemical vapor deposition (MOCVD) processing, the growth substrate 61 is required to be capable of withstanding heat at 1000 degrees C. or higher in an atmosphere of $NH_3$. Further, it is preferable to employ, thereas, a substrate which enables epitaxial growth of a GaN semiconductor in the direction of the c axis. As such a growth substrate 61, it is possible to employ a sapphire substrate with a surface orientation of (0,0,0,1), a silicon substrate with a surface orientation of (1,1,1), and the like.

As the material of the growth mask 62, it is possible to employ any material capable of withstanding the nucleus formation processing and also capable of being easily removed. Examples of the growth mask 62 include $SiO_2$. As the method for forming the hole portions of the growth mask 62, it is possible to employ a method for forming the hole portions according to lift-off processing using a photo resist material, a method for directly forming the other portions than the hole portions according to ink jet processing and the like, a method for directly forming the other portions than the hole portions using a formation mask, and the like.

Figure 4B:
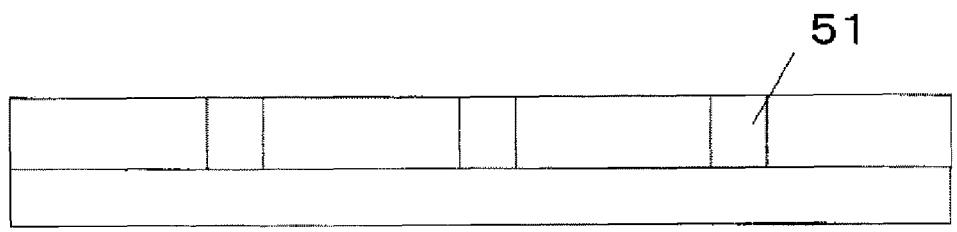
FIG. 4B is a schematic view illustrating a single process subsequent to FIG. 4A, in the method for fabricating phosphor particles.

(b) Thereafter, nucleuses 51 made of a single crystal having a wurtzite-type crystal structure are formed in the hole portions of the growth mask 62 formed on the growth substrate 61 (FIG. 4B). The method for forming the nucleus material is not particularly limited, but it is preferable to employ, thereas, sputtering processing, halide vapor phase epitaxy (HVPE) processing, metal organic chemical vapor deposition (MOCVD) processing, and the like.

Figure 4C:
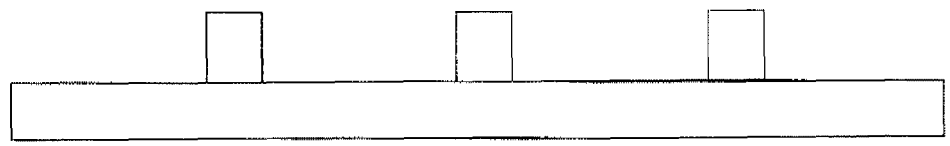
FIG. 4C is a schematic view illustrating a single process subsequent to FIG. 4B, in the method for fabricating phosphor particles.
Figure 4D:
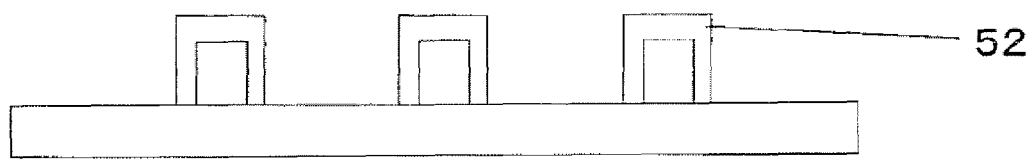
FIG. 4D is a schematic view illustrating a single process subsequent to FIG. 4C, in the method for fabricating phosphor particles.

(c) Thereafter, the growth mask 62 is removed (FIG. 4C). At this time, in the processing for removing the growth mask 62, it is necessary to employ, therefor, a method which exerts no influence on the nucleuses 51. Also, plural nucleuses 51 can be formed on the growth substrate 61 such that they form a grove of nucleuses. For example, it is possible to employ a method introduced in a non-Patent Document (Jpn. J. Appl. Phys. Vol. 38 (1999), pp 6873-6877), in order to form a grove of nucleuses made of ZnO directly on a substrate 61.

Figure 4E:
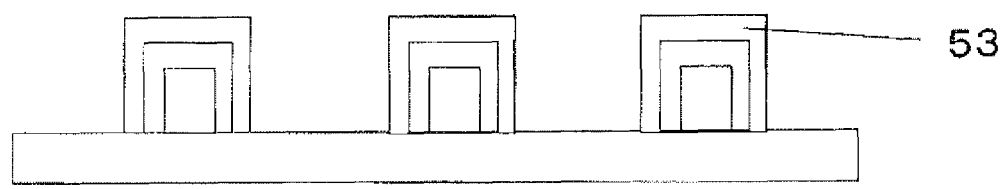
FIG. 4E is a schematic view illustrating a single process subsequent to FIG. 4D, in the method for fabricating phosphor particles.

(d) Thereafter, an n-type semiconductor 52 is formed around the nucleuses 51 (FIG. 4D) and, then, a p-type semiconductor 53 is formed around the n-type semiconductor 52 (FIG. 4E). As the method for forming the n-type semiconductor 52 and the p-type semiconductor 53, it is possible to employ halide vapor phase epitaxy (HVPE) processing, metal organic chemical vapor deposition (MOCVD) processing, and the like, as described above.

Figure 4F:
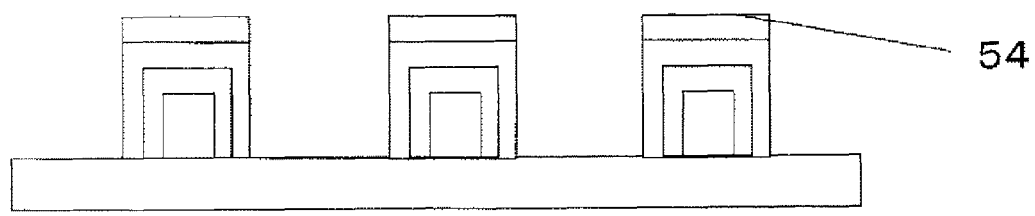
FIG. 4F is a schematic view illustrating a single process subsequent to FIG. 4E, in the method for fabricating phosphor particles.

(e) Thereafter, an insulation layer 54 is formed to overlie one end surface out of the end surfaces of each phosphor particle 50 which are perpendicular to the c axis (FIG. 4F). The method for forming the insulation layer 54 is not particularly limited, but it is preferable to employ, thereas, a method capable of growing the insulation layer 54 only on the end surfaces of the phosphor particles 50 which are perpendicular to the c axis while preventing the insulation layer 54 from growing on the side surfaces. Examples thereof include sputtering processing.

Figure 4G:
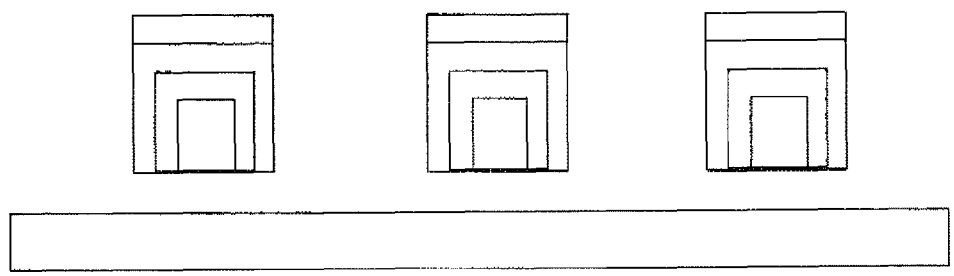
FIG. 4G is a schematic view illustrating a single process subsequent to FIG. 4F, in the method for fabricating phosphor particles.

(f) The phosphor particles 50 are separated from the growth substrate 61 (FIG. 4G). As the method for separating the phosphor particles, it is possible to employ a mechanical method, such as a method for applying vibrations thereto or a method for scraping the phosphor particles off using a sharp object, and, also, it is possible to employ a chemical method such as dissolving the substrate.

In the aforementioned way, it is possible to provide phosphor particles 50 including a nucleus 51 and further including an n-type semiconductor 52, a p-type semiconductor 53, and an insulation layer 54 formed to overlie one end surface out of the end surfaces perpendicular to the c axis, which are formed in the mentioned order around the nucleus 51.

EXAMPLES

First Example

Hereinafter, there will be described a method for fabricating a light emitting device according to the first example. In this case, at first, phosphor particles were formed, and the resultant phosphor particles were sandwiched between electrodes to form a light emitting device.

(a) A sapphire substrate having a surface orientation of (0,0,0,1) and having a diameter of 5.08 cm (2 inches) was employed as a growth substrate 61. An $SiO_2$ film with a thickness of 5 micrometers was formed as a growth mask 62 on the sapphire substrate 61 through a formation mask, through sputtering. It was formed through sputtering, using a $SiO_2$ target as a target, in an atmosphere of an Ar gas. The growth mask 62 had hole portions with a diameter of 3 micrometers.

(b) An AlN film was formed as nucleuses 51 thereon through sputtering. It was formed through sputtering, using an Al target as a target, in an atmosphere of an $N_2$ gas. The AlN was grown in the direction of the c axis to have a thickness of 5 micrometers.

(c) The growth substrate 61 having the growth mask 62 and the nucleuses 51 formed thereon was dipped into a 3% hydrofluoric acid solution to remove the growth mask 62 therefrom.

Figure 5:
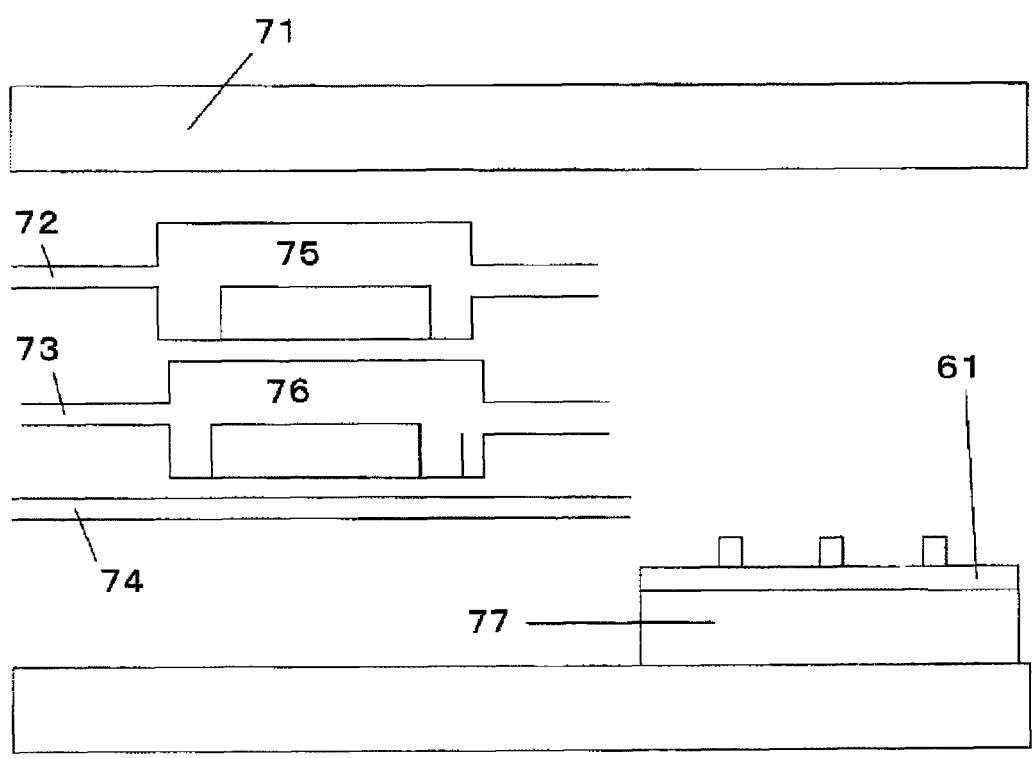
FIG. 5 is a schematic view of an HVPE apparatus for fabricating phosphor particles.

(d) On the growth substrate 61 having only the nucleuses 51 formed thereon, a non-doped GaN layer as an n-type semiconductor layer 52 was formed around the nucleuses 51, through halide vapor phase epitaxy (HVPE) processing. Hereinafter, this will be described in detail, with reference to FIG. 5.

1) HCl was flowed at a flow rate of 3 cc/min and, further, $N_2$ was flowed at a flow rate of 250 cc/min through a gas line A72, and a Ga metal 75 was provided halfway therethrough. Nothing was flowed through a gas line B, while $NH_3$ was flowed at a flow rate of 250 cc/min through a gas line C. Further, $N_2$ was flowed at a flow rate of 3000 cc/min through the entire oven.

2) The temperature in the reaction oven 71 was set to 1000 degrees C., and a non-doped GaN film as a n-type semiconductor layer 52 was grown for 2 minutes to have a layer thickness of 2 micrometers.

(e) After forming the n-type semiconductor layer (the non-doped GaN layer) 52 on the nucleuses 51, a p-type semiconductor layer 53 was formed. This will be described with reference to FIG. 5, similarly.

1) HCl was flowed at a flow rate of 3 cc/min and, further, $N_2$ was flowed at a flow rate of 250 cc/min through the gas line A72, and a Ga metal 75 was provided halfway therethrough. An $MgCl_2$ powder 76 was provided in the gas line B, and an $N_2$ gas was flowed at a flow rate of 250 cc/min therethrough. $NH_3$ was flowed at a flow rate of 250 cc/min through the gas line C. Further, $N_2$ was flowed at a flow rate of 3000 cc/min through the entire oven.

2) The temperature in the reaction oven 71 was set to 1000 degrees C., and a Mg-doped GaN film 53 was grown for 2 minutes to have a layer thickness of 2 micrometers.

3) After the reaction, the temperature was descended while $N_2$ was kept flowed through the entire oven at a flow rate of 3000 cc/min. Then, after the temperature had been descended to 700 degrees C., the temperature was maintained thereat for 1 hour. Thereafter, the temperature in the oven was descended again.

In the aforementioned way, a p-type semiconductor layer 53 made of an Mg-doped GaN film was formed.

(f) After forming the p-type semiconductor layer 53, the growth substrate 61 was extracted and was mounted in a sputtering apparatus, and an $Al_2O_3$ film as an insulation layer 54 was formed through sputtering processing. It was formed through sputtering, using an $Al_2O_3$ target as a target, in an atmosphere of an Ar gas. Its thickness was 3 micrometers.

(g) After forming the insulation layer 54, mechanical vibrations were applied thereto to extract the phosphor particles 50 from the growth substrate 61.

(h) The phosphor particles 50 were dispersed on a glass substrate, which was a lower substrate 10 having an ITO film with a thickness of 200 nm as a lower electrode 20 formed on its upper surface.

(i) Further, a glass substrate 40 coated with a silver paste with a thickness of 2 micrometers as an upper electrode 30 was prepared, and the glass substrate 40 was pressed against the lower substrate 10 with its paste surface faced downwardly to form a light emitting device 70.

(j) The lower substrate 10 was coated, at its lower side, with a paste containing an acrylic resin and ZnS:Cu, Al fluorescent material dispersed therein.

In the aforementioned way, the light emitting device 70 was provided.

A direct voltage of 15 V was applied to the resultant light emitting device 70 with its side of the ITO 20 served as an anode and with its side of the silver paste 30 served as a cathode to cause light emission therefrom. At this time, an ultraviolet ray was emitted from the phosphor particles 50, but its wavelength was changed by the ZnS:Cu, Al fluorescent material to cause light emission in a green color. The luminance thereof was 580 cd/m$^2$, and the light emission efficiency was 1.21 m/W.

First Comparison Example

As a light emitting device according to the first comparison example, a light emitting device was formed according to the same method as that of the first example, except that no insulation layer was formed on the phosphor particles.

A voltage was applied to this light emitting device similarly to in the first example to cause light emission therefrom. Its luminance was 410 cd/m$^2$, and the light emission efficiency was 0.71 m/W.

Second Comparison Example

For comparison with the first comparison example, a light emitting device was formed in the same way as that of the first comparison example, except that only an n-type semiconductor layer with a thickness of 4 micrometers was formed, instead of forming a p-type semiconductor layer on the phosphor particles.

A voltage was applied to this light emitting device similarly to in the first example to cause light emission therefrom. Its luminance was 80 cd/m$^2$, and the light emission efficiency was 0.151 m/W.

According to the present invention, it is possible to provide a light emitting device having a high light emission efficiency and being capable of easily having a larger area.

The invention claimed is:

1. A light emitting device comprising:
   a pair of electrodes facing to each other; and
   a phosphor layer which is sandwiched between the pair of electrodes and includes phosphor particles placed therein;
   wherein one phosphor particle includes an n-type nitride semiconductor part and a p-type nitride semiconductor part, the n-type nitride semiconductor part and the p-type nitride semiconductor part are made of respective single crystals having wurtzite-type crystal structures having c axes parallel with each other, and
   the phosphor particle includes an insulation layer provided to overlie one end surface out of their end surfaces perpendicular to the c axes.

2. The light emitting device according to claim 1, wherein the phosphor particle is formed by laminating the n-type nitride semiconductor part and the p-type nitride semiconductor part in a direction perpendicular to the c axes.

3. The light emitting device according to claim 1, wherein the phosphor particle further includes a nucleus crystal made of a single crystal, and
   the n-type nitride semiconductor part and the p-type nitride semiconductor part are formed to overlie the periphery of the nucleus.

4. The light emitting device according to claim 3, wherein the phosphor particle is formed by laminating the p-type nitride semiconductor part and the n-type nitride semiconductor part, in the mentioned order, around the nucleus crystal.

5. The light emitting device according to claim 3, wherein the phosphor particle is formed by laminating the n-type nitride semiconductor part and the p-type nitride semiconductor part, in the mentioned order, around the nucleus crystal.

6. The light emitting device according to claim 1, wherein at least one of the n-type nitride semiconductor part and the p-type nitride semiconductor part which constitute the phosphor particles is exposed at an outer surface and, further, is electrically contacted with at least one of the pair of electrodes.

7. The light emitting device according to claim 1, wherein the n-type nitride semiconductor part and the p-type nitride semiconductor part which constitute the phosphor particles are made of GaN.

* * * * *